United States Patent [19]

Patterson

[11] 4,243,952
[45] Jan. 6, 1981

[54] TEMPERATURE COMPENSATED BIAS CIRCUIT FOR SEMICONDUCTOR LASERS

[75] Inventor: David R. Patterson, Trenton, N.J.

[73] Assignee: RCA Corporation, New York, N.Y.

[21] Appl. No.: 955,625

[22] Filed: Oct. 30, 1978

[51] Int. Cl.³ .............................................. H01S 3/13
[52] U.S. Cl. .............................................. 331/94.5 S
[58] Field of Search ...................... 331/94.5 S, 94.5 H; 307/310, 311, 297, 315

[56] References Cited

U.S. PATENT DOCUMENTS

| | | | |
|---|---|---|---|
| 3,751,726 | 8/1973 | Einthoven et al. | 307/315 |
| 3,973,852 | 8/1976 | Moore et al. | 331/94.5 S |
| 3,987,318 | 10/1976 | Meijer | 307/310 |
| 4,092,614 | 5/1978 | Sakuma | 331/94.5 H |
| 4,142,115 | 2/1979 | Nakada et al. | 307/315 |

OTHER PUBLICATIONS

RCA Technical Note No. 1005, "Stabilization of CW Injection Lasers" by Wittke, Patterson and Landay.

Primary Examiner—William L. Sikes
Assistant Examiner—Leon Scott, Jr.
Attorney, Agent, or Firm—Paul J. Rasmussen; Peter M. Emanuel; Allan J. Jacobson

[57] ABSTRACT

Within a power supply circuit for a semiconductor laser, output current is maintained constant at each temperature level over an operating range and the magnitude of that constant current is varied directly with temperature to maintain the light output of the laser substantially constant over the operating temperature range. In the preferred embodiment, the negative temperature coefficient characteristic of the base-emitter junction voltage for bipolar transistors is utilized to compensate for the negative temperature coefficient characteristic of the light output from the semiconductor laser.

11 Claims, 1 Drawing Figure

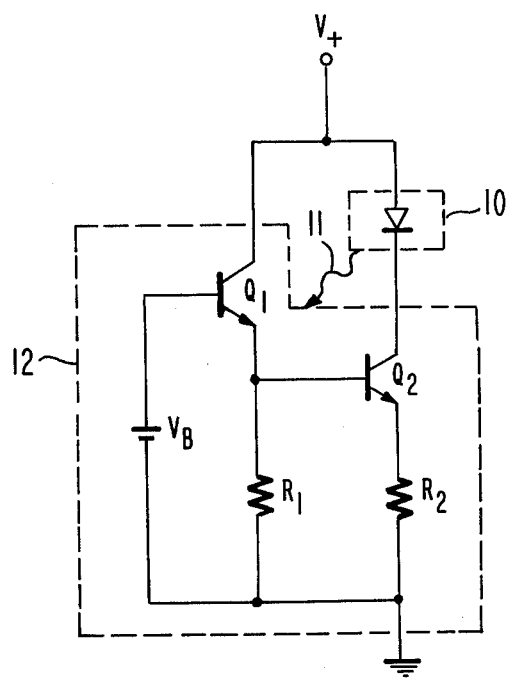

TEMPERATURE COMPENSATED BIAS CIRCUIT FOR SEMICONDUCTOR LASERS

The present invention relates to a temperature compensated circuit for controlling the supply of power to a semiconductor laser.

As is known in the art, light output varies inversely with temperature from a semiconductor laser having a fixed level of drive current applied thereto. Over an operating temperature range, a constant level of light output from such lasers is presently accomplished in the art with either an optical feedback system, or by supplying constant current power to the laser and incorporating a thermoelectric cooling system to maintain the laser environment at a constant temperature. However, the circuitry and apparatus required by these approaches are more complex and costly than desired.

The circuitry of the invention provides a temperature-dependent current supply means for applying current to a laser, the magnitude of which current is primarily responsive to the temperature of the laser, rather than to the light output, for maintaining the light output of the laser substantially constant over an operating temperature range. The temperature-dependent current supply of the invention provides current from a power source to a laser, which current is substantially constant with respect to certain parameters other than temperature, such as with respect to the voltage from the power source. In a preferred embodiment, a pair of bipolar transistors are arranged to supply current to the laser. The base-emitter junctions of the transistors are disposed so that the negative temperature coefficient characteristic of the voltage drop thereacross causes the magnitude of the constant current to vary directly with temperature.

In the drawing, a block diagram of the invention is illustrated in the sole figure, along with a schematic diagram for the preferred embodiment thereof.

In the block diagram of the sole figure, a laser diode 10 receives power from a voltage source +V to produce a light output which varies inversely with operating temperature for a constant current therethrough. Most applications for the laser diode 10 require that its light output be maintained at a constant level over an operating temperature range. This requirement is accomplished by the laser power supply circuitry of this invention through an open loop supply means 12 for applying current to the laser 10 and for varying the magnitude of the current directly with temperature. It should be understood without further explanation that supply means 12 is thermally coupled with the laser diode 10 via means 11 and therefore continuously related temperatures exist therebetween.

The supply means 12 operates to drive the laser diode 10 with a magnitude of current above its lasing threshold at each operating temperature level. Consequently, the light output level from the laser diode 10 is maintained constant at each operating temperature level due to the magnitude of drive current that is applied thereto. Furthermore, the supply means 12 also operates to vary the magnitude of laser drive current directly with laser temperature and thereby the light output from the laser diode 10 is held substantially constant over an operating temperature range. Therefore, the supply means 12 controls the drive current of the laser diode 10 to produce a substantially constant light output therefrom over the operating temperature range thereof.

Although other embodiments of the invention are possible, one preferred embodiment thereof is shown in the schematic diagram of the sole figure. A pair of bipolar transistors $Q_1$ and $Q_2$ of the same conductivity type are disposed within the current means 12 in this preferred embodiment. A voltage source +V is applied to the collector of $Q_1$, while a reference voltage such as ground, is applied to the emitter of $Q_1$ through a resistor $R_1$. The voltage source +V is also applied to the collector of $Q_2$ through the laser diode 10, while the reference voltage is applied to the emitter of $Q_2$ through a resistor $R_2$. A bias voltage $V_B$ of a value between +V and ground is applied to the base of $Q_1$, while the base of $Q_2$ is connected to the emitter of $Q_1$.

Assuming that +V and $V_B$ are constant, and of sufficient magnitude to render both $Q_1$ and $Q_2$ conductive, the collector current of $Q_2$ will be constant at each temperature level over the operating range of the laser diode 10. This is so because the emitter-follower actions of Q1 and Q2 place a potential equal to $V_B$ less their respective emitter-to-base offset potentials across R2 at each temperature level over the operating range. The current feedback afforded Q2 by its emitter degeneration resistor R2 adjusts its emitter current to that value which satisfies the Ohm's Law relationship between the voltage impressed across R2 and its resistance. The emitter current of Q2 is equal to the sum of its collector current and its much smaller base current, so determining the emitter current of Q2 essentially determines its collector current. Since the collector current of $Q_2$ is also the drive current of the laser diode 10, that drive current must also be constant to render the light output from the laser diode constant, at each temperature level over the operating range.

Kirchhoff's voltage theorem can be applied for the circuit loop containing $V_B$, the base-emitter junctions of $Q_1$ and $Q_2$, and $R_2$ to derive the equation for the constant drive curren $I_L$ of the laser diode 10 at each temperature level. Assuming that $Q_1$ and $Q_2$ are substantially identical and that each has a high current gain characteristic, this derivation results in the following equation:

$$I_L = (V_B - 2V_{BE}/R_2)$$

where $V_{BE}$ is the base-emitter voltage drop encountered across each of $Q_1$ and $Q_2$.

As is known to those skilled in the art of electronic circuits, the base-emitter voltage drop across bipolar transistors demonstrates a negative temperature coefficient characteristic. From the above equation it can therefore be seen that the level of $I_L$ will vary directly with temperature. As is known to those skilled in the art of laser operation, the light output from the laser diode 10 demonstrates a negative temperature coefficient characteristic for a constant drive current $I_L$. Consequently, the above equation may be applied to render the light output from the laser diode 10 substantially constant over an operating temperature range. In so doing, however, the values of $V_B$ and $R_2$ must be selected for compatability with the temperature coefficient characteristics of $Q_1$, $Q_2$ and the laser diode 10.

As an example of this compatability, it will be assumed that the laser diode 10 encounters a constant drive current $I_L$ swing from 56 milliamperes to 71 milliamperes in maintaining a desired constant light output of 4 milliwatts over an operating temperature range of 0° to 40° C. Also, the 20° C. value of $V_{BE}$ for each of $Q_1$ and $Q_2$ is 0.76 volts and each encounters a $V_{BE}$ decrease of 62 millivolts over the 0°–40° C. operating temperture range. $R_2$ is sized to derive the required 15 milliamperes change in $I_L$ from the total 124 millivolts change encountered in $V_{BE}$ across $Q_1$ and $Q_2$, so that $R_2$ will be 8.3 ohms. Because $V_B$ is of a constant magnitude for this example, it is sized by inserting the mid-operating temperature range (20° C.) values for $I_L$ and $V_{BE}$ in the above-equation along with the 8.3 ohm value for $R_2$, so that the value of $V_B$ will be 2.05 volts.

Although the negative temperature coefficient characteristic of $V_{BE}$ for $Q_1$ and $Q_2$ is more linear than the temperature coefficient characteristic of $I_L$ for the laser diode 10, the circuitry shown in the sole figure has been utilized to maintain the light output from the laser diode 10 substantially constant without requiring additional circuitry. Furthermore, circuitry is known for deriving additional temperature compensation by applying a non-linear $V_B$ from a voltage divider network which incorporates a thermistor. Also, $Q_1$ and $Q_2$ need not have identical characteristics in the circuitry of the invention which is not restricted to D.C. operation and has been utilized in laser pulse drivers.

Therefore, this invention has been disclosed herein by describing only a selected embodiment thereof and it should be understood by those skilled in the art that numerous changes in the details of construction and the combination or arrangement of parts could be made in the described embodiments without departure from the true scope or spirit of the invention. Consequently, the present disclosure should be construed as illustrative rather than limiting.

What I claim is:

1. In a circuit of the type wherein power is supplied to a semiconductor laser from a voltage source, the improvement comprising:
   temperature-dependent current supply means for applying current to the laser from said voltage source, said current supply means being responsive to the temperature thereof for varying the current magnitude directly with temperature in such degree as to maintain the light output of the laser more constant with change in the laser operating temperature; and
   means for thermally coupling said temperature-dependent current supply means with the laser so that continuously related temperatures exist therebetween.

2. The circuitry of claim 1 wherein said supply means includes first and second bipolar transistors of the same conductivity type; said first transistor having the voltage source applied to its collector, a reference voltage applied to its emitter through a first resistance, and a bias voltage applied to its base; said second transistor having the voltage source applied to its collector through the laser, said reference voltage applied to its emitter through a second resistor, and its base connected to the emitter of said first transistor; said second resistor being of a value equal to the emitter-base voltage change encountered across both said first and second transistors over an operating temperature range divided by the laser drive current change encountered in maintaining the constant level of light output over the operating temperature range; said bias voltage being equal to the emitter-base voltage drop encountered across both said first and second transistors at the mid-point in the operating temperature range plus the quantity of said second resistance multiplied by the laser current drawn in maintaining the constant level of light output at the mid-point in the operating temperature range.

3. In combination:
   a semiconductor laser; and
   temperature-dependent current supply means responsive to the operating temperature of said semiconductor laser for supplying it a drive current which increases as its operating temperature increases at a rate which tends to maintain the light emitter by said semiconductor laser substantially constant, said temperature-dependent current supply means including
   a resistance,
   means to which said semiconductor laser is thermally coupled for applying a positive temperature coefficient potential across said resistance to cause a positive temperature coefficient current therethrough, and
   means proportionally responsive to the current through said resistance for supplying said drive current.

4. A combination as set forth in claim 3 wherein said means for applying a positive temperature coefficient potential includes:
   potential offsetting means, in series connection with said resistance, for exhibiting a negative temperature coefficient offset potential, and
   means for applying a fixed potential across said series connection.

5. A combination as set forth in claim 4 having a transistor the emitter-base junction of which is included in said potential offsetting means, being poled for forward conduction, and the collector-emitter circuit of which corresponds to said means for supplying said drive current.

6. A combination as set forth in claim 5 wherein said potential offsetting means includes at least one other semiconductor junction besides said emitter-base junction poled for forward conduction and serially connected with said emitter-base junction.

7. A temperature compensated circuit for supplying power to a semiconductor laser to maintain its light output more constant as its operating temperature changes, comprising:
   current supply means responsive to temperature for applying a current to the laser and for varying the current magnitude directly with temperature; and
   means for thermally coupling said laser to said current supply means so the temperature of said current supply is continuously related to that of said laser.

8. A temperature compensated circuit according to claim 7 wherein said current supply means varies the magnitude of the current it applies to the laser directly with the temperature of the current supply means in such degree as to maintain the light output of the laser substantially constant over a predetermined temperature range.

9. A temperature compensated circuit according to claim 7 wherein said current supply means comprises:
   a semiconductor junction;
   means for forward-biasing said semiconductor junction; and
   means responsive to the potential across said semiconductor junction for providing an output current to said laser, the magnitude of said output current being inversely related to the potential across said semiconductor junction.

10. A temperature compensated circuit according to claim 9 wherein said semiconductor junction comprises the base-emitter junction of a bipolar transistor; and wherein said means responsive to the potential across said semiconductor junction for providing an output current to said laser comprises the collector-emitter current conduction path of said bipolar transistor connected in series with said laser, said bipolar transistor connected at the collector electrode thereof to said laser.

11. A temperature compensated circuit according to claim 10 wherein said means for forward-biasing said semiconductor junction comprises:

a resistor connected in series with said collector-emitter current conduction path, said resistor connected to the emitter electrode thereof; and a bias supply connected to conduct current through the series connection of said emitter-base junction and said resistor in such direction as for conditioning said semiconductor junction for forward conduction.

* * * * *